(12) United States Patent
Ohuchi

(10) Patent No.: US 6,734,092 B2
(45) Date of Patent: May 11, 2004

(54) SEMICONDUCTOR DEVICE AND MANUFACTURING METHOD THEREOF

(75) Inventor: Shinji Ohuchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/878,375

(22) Filed: Jun. 12, 2001

(65) Prior Publication Data

US 2001/0046764 A1 Nov. 29, 2001

Related U.S. Application Data

(62) Division of application No. 09/497,684, filed on Feb. 4, 2000, now Pat. No. 6,271,588.

(30) Foreign Application Priority Data

Feb. 8, 1999 (JP) ............................................. 11-29479

(51) Int. Cl.$^7$ ............................................. H01L 21/44
(52) U.S. Cl. ...................... 438/613; 438/614; 438/617; 438/597

(58) Field of Search ................................ 438/613, 614, 438/617, 597, 598, 113, 599; 257/734

(56) References Cited

U.S. PATENT DOCUMENTS

| | | | |
|---|---|---|---|
| 5,672,912 A | | 9/1997 | Aoki et al. |
| 6,159,837 A | * | 12/2000 | Yamaji et al. |
| 6,187,615 B1 | * | 2/2001 | Kim et al. ................. 438/113 |
| 6,271,127 B1 | * | 8/2001 | Liu et al. ................... 438/638 |
| 6,472,745 B1 | * | 10/2002 | Iizuka ........................ 257/723 |

* cited by examiner

*Primary Examiner*—Wael Fahmy
*Assistant Examiner*—Nathan W. Ha
(74) *Attorney, Agent, or Firm*—Volentine Francos, PLLC

(57) ABSTRACT

Protective tape is bonded onto a rear surface of a semiconductor element prior to a resin sealing step, and then only a primary surface of the semiconductor element is sealed with a resin layer. Cracks and warping which would otherwise be caused by an external force or foreign matter at an exposed rear surface of the semiconductor element are prevented. This facilitates a surface polishing step and also results in a lower profile for the semiconductor device, because the rear surface is not sealed with resin.

26 Claims, 8 Drawing Sheets

SEMICONDUCTOR DEVICE AND MANUFACTURING METHOD THEREOF

CROSS REFERENCE TO RELATED APPLICATIONS

This is a divisional application of application Ser. No. 09/497,684, filed Feb. 4, 2000 now U.S. Pat. No. 6,271,588, which is hereby incorporated by reference in its entirety for all purposes.

BACKGROUND OF THE INVENTION

The present invention relates to a semiconductor device, and more specifically, it relates to a resin-sealed semiconductor device and a manufacturing method thereof.

With mobile apparatuses such as notebook computers having come to be used widely in recent years, resin-sealed semiconductor devices mounted in such apparatuses need to achieve a lower profile, further miniaturization and reduced weight. Accordingly, numerous resin-sealed semiconductor devices have been proposed in response to these technical requirements.

FIG. 4 illustrates an example of such a semiconductor device in the prior art. Wiring 104 constituted of copper (Cu) are electrically connected to electrode pads 102 formed at the primary surface of a semiconductor element 100. Cu posts 106 having a height of approximately 150 micrometer are connected with the wiring 104. Then, a resin layer 108 is formed at a height corresponding to the height of the Cu posts 106 for sealing. External connection terminals constituted of a metal such as solder balls 110 are formed at the tips of the Cu posts 106 that are exposed.

The process up to this point is implemented on a wafer with a plurality of semiconductor elements 100 arrayed thereon. Then, the wafer undergoes a dicing process to be divided into individual pieces. The resulting semiconductor devices are so-called chip-size package semiconductor devices whose size is very close to the size of the semiconductor elements.

During the process for manufacturing the device described above, a wafer comprising a plurality of semiconductor elements 100 is set at a mold die constituted of an upper die 112 and a lower die 114, as illustrated in FIG. 5, to achieve sealing with a resin so as to completely cover the Cu posts 106.

If foreign matter such as dirt is present inside the mold die at this time, the foreign matter may come into contact with the rear surfaces of the semiconductor elements 100 to scar them and even cause cracks 116.

In addition, surface polishing is performed by using an abrasive material 118, as illustrated in FIG. 6 to expose the tips of the Cu posts 106 after the resin curing process.

During the polishing process, the wafer is vacuum held through vacuum holes 122 formed at a polishing stage 120 to secure the wafer. However, if the wafer is warped, the vacuum hold may not be successful, which, in turn, may make it impossible to perform surface polishing.

Such warping of the wafer occurs due to the difference between the coefficient of expansion of the wafer (the semiconductor element 100) and the coefficient of expansion of the resin layer 108 sealed thereupon. Such warping occurs to varying degrees depending upon the thickness of the resin layer 5 and the type of material used to constitute the resin layer 5.

In addition, semiconductor devices achieved by forming a sealing resin layer at the rear surfaces of the semiconductor elements as well as at the primary surfaces have been proposed in recent years. However, there is a problem in that since the resin is injected at both surfaces, the total thickness of the resin layer increases.

SUMMARY OF THE INVENTION

By addressing the problems of the prior art discussed above, according to the present invention, the primary surface of a semiconductor element is sealed with a resin layer and protective tape is bonded to its rear surface.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENT

The following is a detailed explanation of the semiconductor device and the manufacturing method thereof in a preferred embodiment of the present invention given in reference to the attached drawings.

Figure 1:
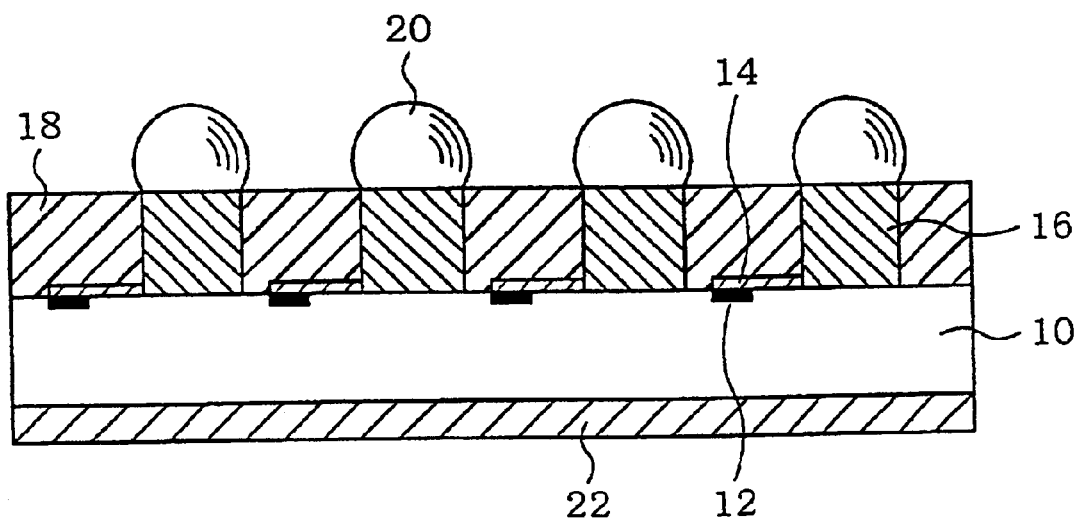
FIG. 1 is a sectional view of an embodiment of the present invention.

FIG. 1 is a sectional view of the semiconductor device in an embodiment of the present invention. The method that is employed to manufacture this semiconductor device is explained. First, electrode pads 12 are formed at the primary surface of semiconductor elements 10. Next, wirings 14 constituted of Cu which are to function as means for electrical connection are connected to the electrode pads 12. Then Cu posts 16 constituting means for electrical connection are connected to the wirings 14 and are formed to achieve a specific height. The primary surfaces of the Cu posts 16 are then sealed with a resin layer 18. Then, solder balls 20 constituting external connection terminals are mounted at the exposed tips of the Cu posts 16.

In this embodiment, protective tape 22 is bonded to the rear surfaces of the semiconductor elements 10. The protective tape 22, which is constituted of a hardened synthetic resin achieving a bonding function such as polyimide or an epoxy resin, protects the rear surfaces of the semiconductor elements 10, which are constituted of a fragile material.

As explained above, since the rear surfaces of the semiconductor elements 10 are protected by bonding the protective tape 22 in the embodiment of the present invention, cracking due to any external force that may be applied to them or due to contact with foreign matter is prevented from occurring. In addition, since only the primary surfaces of the semiconductor elements 10 are sealed with the resin and their rear surfaces are bonded with the protective tape 22, resin injection must be implemented only at one side to facilitate the filling process, and a chip-size package semiconductor device achieving a low profile is realized.

FIG. 2 shows the semiconductor device manufacturing method according to the present invention by presenting individual manufacturing steps in sectional views.

Figure 2A:
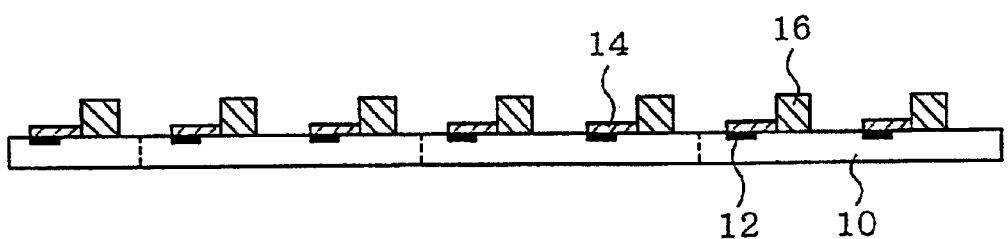
FIGS. 2(a)–2(c) illustrate the manufacturing method according to the present invention (part 1)

FIG. 2(a) illustrates a step in which a wafer having a plurality of semiconductor elements 10 formed thereon is prepared. As has already been explained, the electrode pads 12 are formed at the primary surfaces of the individual semiconductor elements 10, with the wirings 14 constituted of Cu and the Cu posts 16 both to function as a means for electrical connection connected to the electrode pads 12.

Figure 2B:
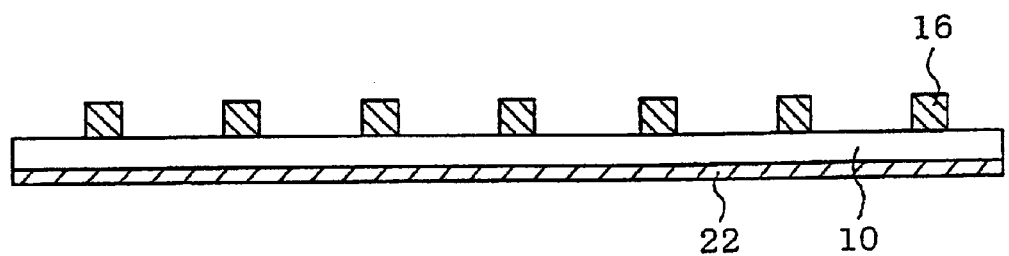

FIG. 2(b) illustrates a step in which the protective tape 22 in a size roughly the same as the size of the wafer is bonded to the rear surface of the wafer. It is to be noted that the illustration of the electrode pads 12 and the wirings 14 is omitted in FIG. 2(b) and the subsequent drawings.

The protective tape 22 may be applied through bonding onto the rear surface of the wafer by adopting a method similar to that employed for the application of regular dicing tape.

Figure 2C:
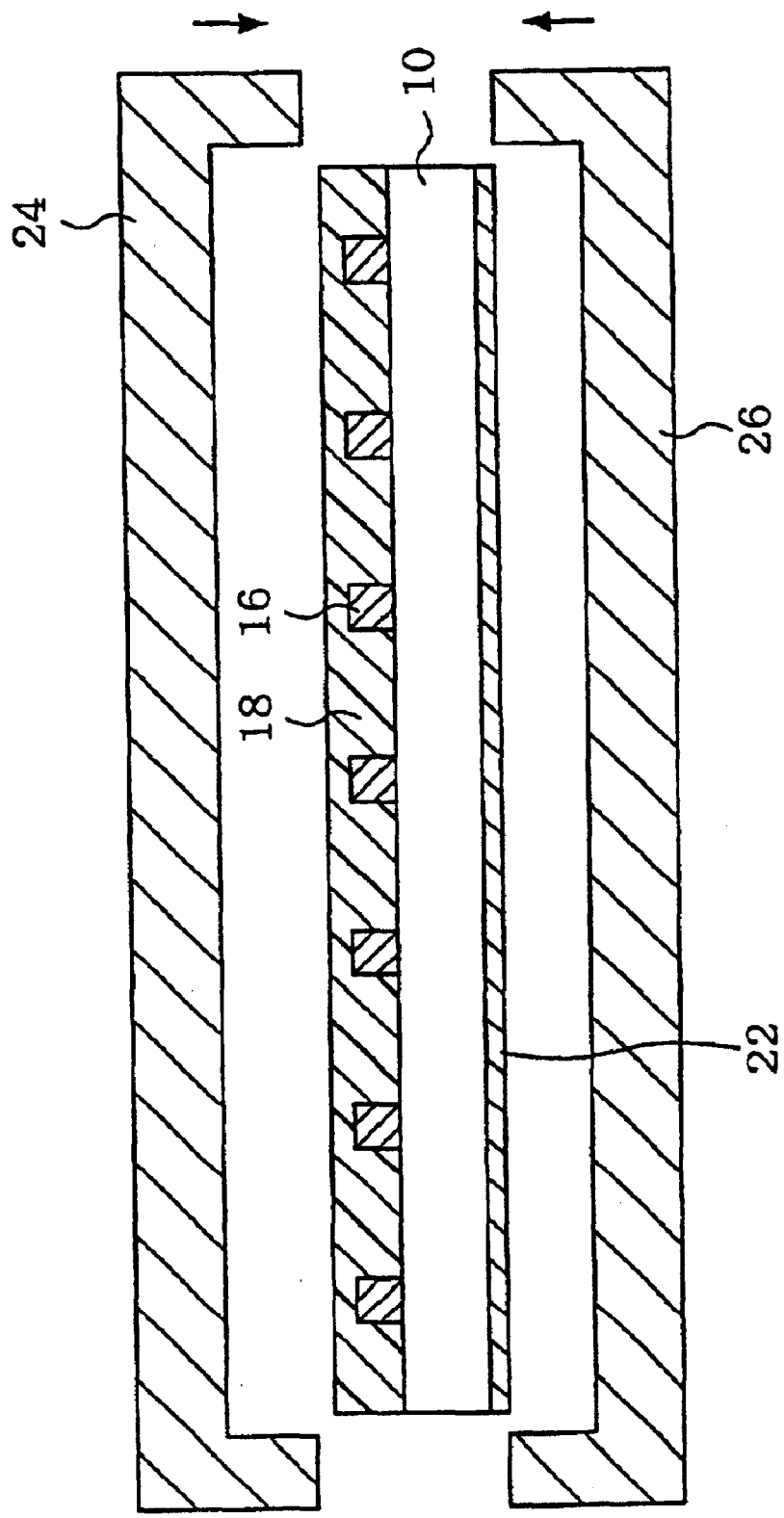

FIG. 2(c) illustrates the resin sealing step. The wafer with the protective tape 22 applied onto the rear surface thereof is set at a mold die constituted of an upper die 24 and a lower die 26. Then, a resin is injected to completely cover the Cu posts 16. Next, a heat treatment is performed to form the resin layer 18 so that the primary surfaces of the semiconductor elements 10 become sealed with resin.

At this point, since the rear surface of the wafer (the semiconductor elements 10) is covered by the protective tape 22, foreign matter such as dust inside the die does not come into contact with the rear surface of the wafer and also, the strength is improved. As a result, it is possible to prevent cracks from occurring at the semiconductor elements 10. Moreover, the wafer does not become warped as readily as in the prior art.

Figure 3D:
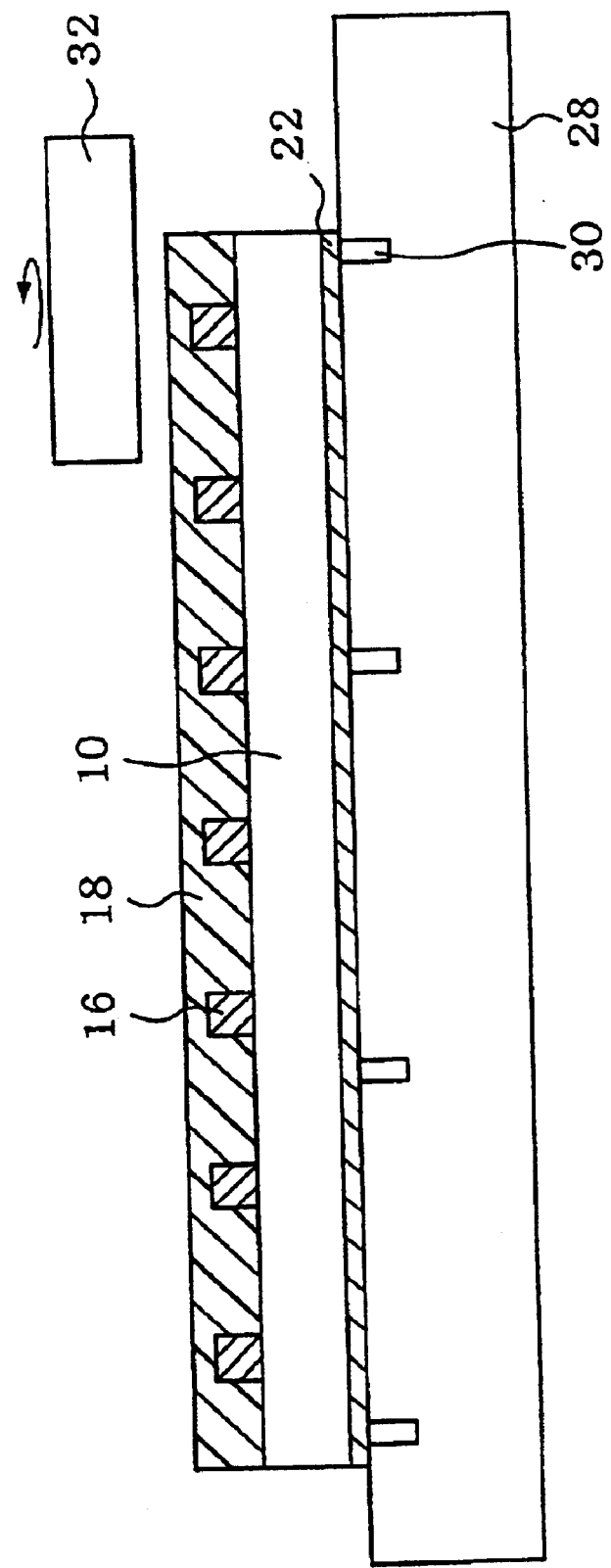
FIGS. 3(d)–3(f) illustrate the manufacturing method according to the present invention (part 2)

FIG. 3(d) illustrates a surface polishing process in which the wafer is secured to a polishing stage 28 through vacuum holding achieved through the vacuum holes 30.

Since the protective tape 22 is bonded to the rear surface of the wafer in the embodiment, the warping of the wafer can be minimized, unlike in the prior art and, as a result, the wafer is secured squarely onto the polishing stage 28. Thus, the resin layer can be polished accurately with a high degree of reliability by using an abrasive material 32 until the tips of the Cu posts 16 become exposed.

The wafer would be caused to become warped due to the difference between the coefficient of expansion of the wafer (the semiconductor elements 10) and the coefficient of expansion of the resin layer 18 sealing the primary surface of the wafer. However, by applying the protective tape 22 to the rear surface, a good balance is achieved with respect to expansion and contraction occurring at the front and rear of the wafer in the embodiment to reduce the degree of warping. Thus, the wafer can be secured onto the polishing stage 28 with greater ease to enable surface polishing to be performed accurately with a high degree of reliability.

Figure 3E:
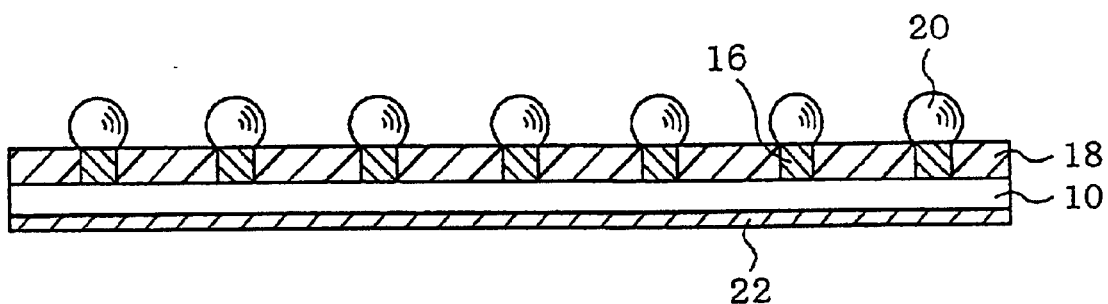

FIG. 3(e) illustrates a step in which the solder balls 20 constituting external connection terminals are mounted at the tips of the Cu posts 16 exposed at the surface of the resin layer 18.

Figure 3F:
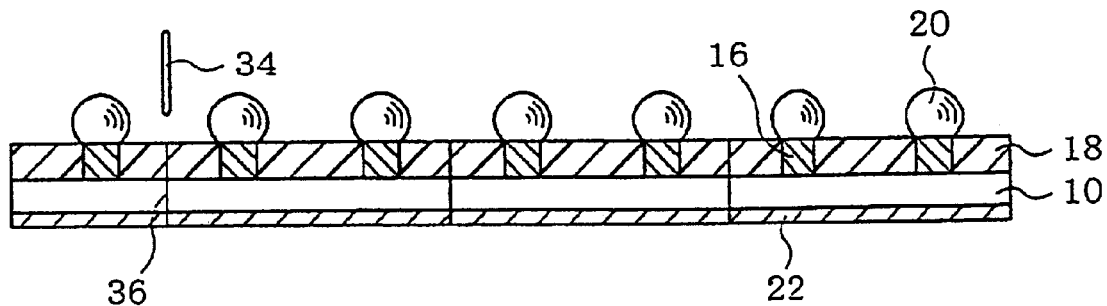
Figure 4:
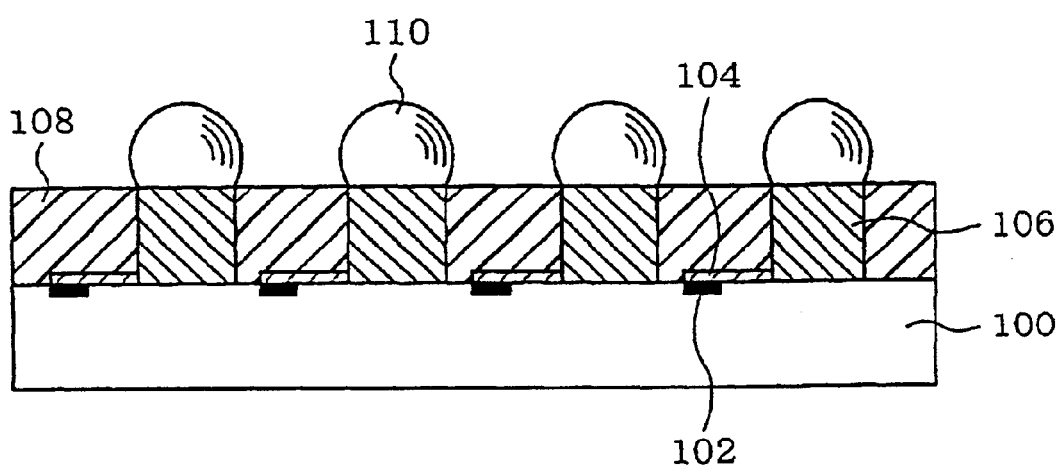
FIG. 4 is a sectional view of a structure adopted in the prior art.
Figure 5:
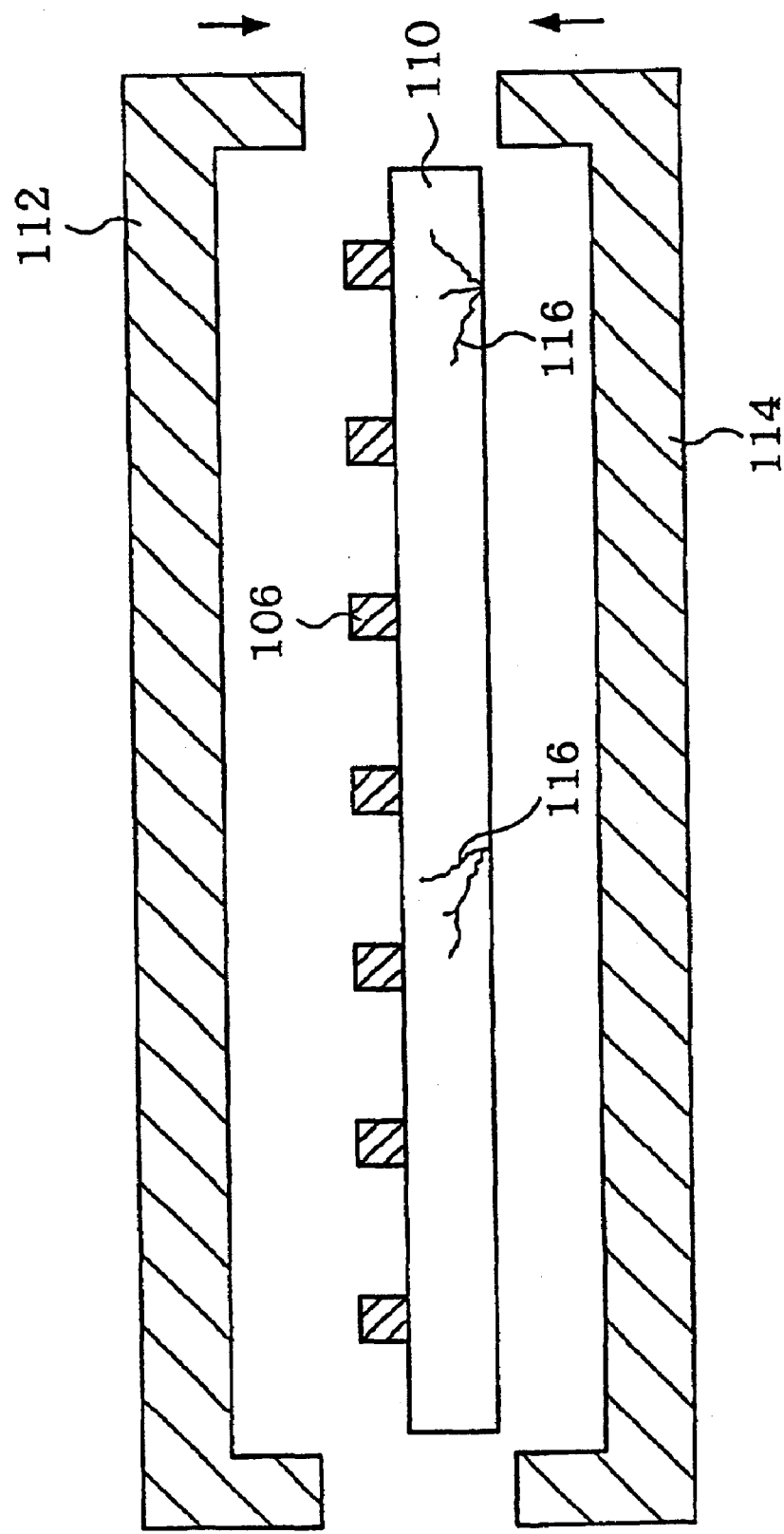
FIG. 5 illustrates a resin sealing process implemented in the prior art.
Figure 6:
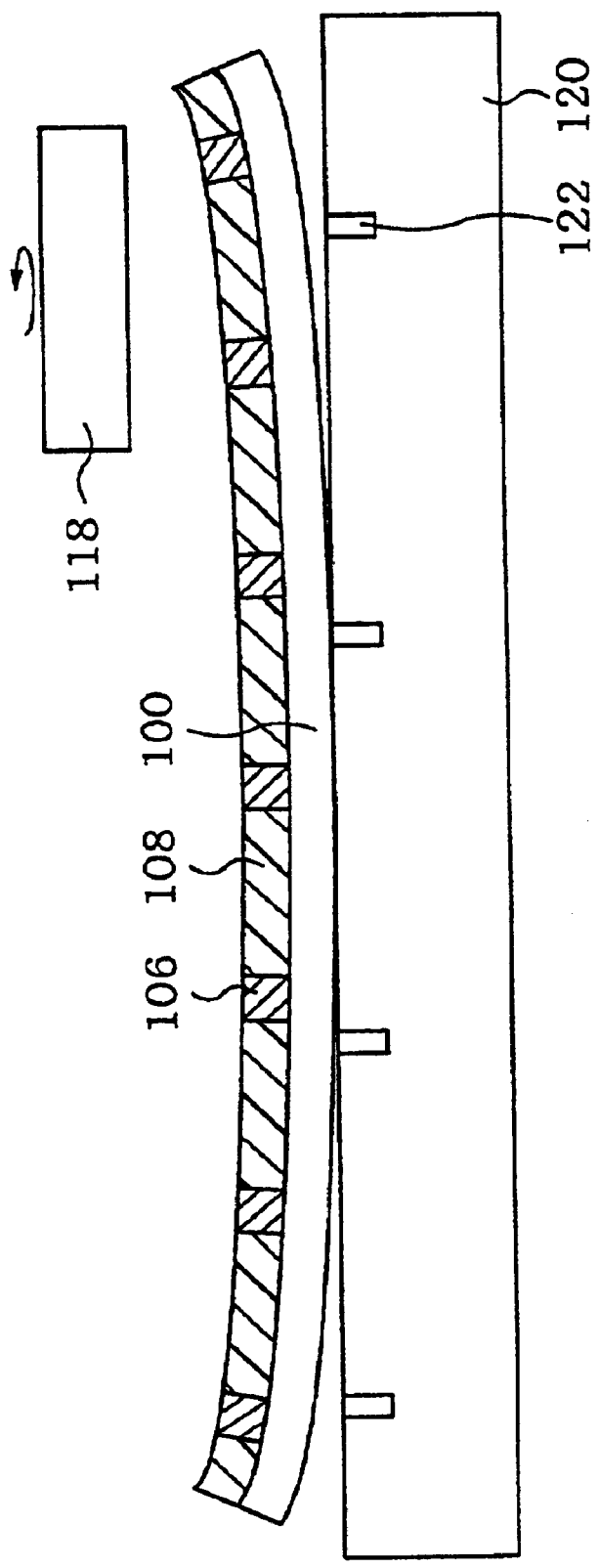
FIG. 6 illustrates a surface polishing process implemented in the prior art.

FIG. 3(f) illustrates a step in which the wafer having undergone the steps described above is cut along cutting lines 36 by a cutting blade 34 to be divided into individual pieces.

While the semiconductor device in the embodiment achieves a lower profile, since only one surface of the semiconductor element 10 is sealed with resin as explained earlier, the rear surface of the wafer is polished to achieve an even lower profile.

During this rear surface polishing, which is implemented following the surface polishing step illustrated in FIG. 3(d), the protective tape 22 is first peeled from the rear surface of the wafer through UV (ultraviolet ray) irradiation and then the rear surface is polished. Since no heat treatment is performed at this point, no problem occurs if the protective tape 22 is peeled off.

It is to be noted that while the wirings 3 and the Cu posts 16 constitute means for electrical connection and the solder balls 20 constitute external connection terminals in the example explained above, the present invention is not restricted to this example.

While the semiconductor device and the manufacturing method thereof have been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

As explained above, according to the present invention, in which the protective tape is bonded onto the rear surface of a semiconductor element, occurrence of cracks due to an external force or the presence of foreign matter can be prevented, and since only the primary surface of the semiconductor element is sealed with resin, the process of injecting the resin is facilitated and a lower profile is achieved.

Furthermore, since the protective tape is bonded onto the rear surface of the wafer before the resin sealing step, scarring of the wafer can be reduced and warping of the wafer can be prevented during the resin sealing step, to facilitate the surface polishing step.

The entire disclosure of Japanese Patent Application No. 11-29479 filed on Feb. 8, 1999 including specification, claims, drawings and summary is incorporated herein by reference in its entirety.

What is claimed is:

1. A semiconductor device manufacturing method comprising:

a step in which a wafer having electrode pads formed at primary surfaces of semiconductor elements and means for electrical connection provided at said electrode pads is prepared;

a step in which protective tape is bonded onto rear surfaces of said semiconductor elements, wherein the rear surfaces are opposite to the primary surfaces of the semiconductor elements;

a step in which said wafer is set at a die and said primary surfaces of said semiconductor elements are sealed with a resin layer;

a step in which a front surface of said resin layer is polished;

a step in which external connection terminals are mounted to said means for electrical connection exposed at said front surface of said resin layer; and a step in which said wafer having undergone the preceding steps is divided into individual pieces, wherein said semiconductor elements are sealed with said resin layer after said protective tape is bonded onto the rear surfaces of said semiconductor elements.

2. A semiconductor device manufacturing method according to claim 1, further comprising:
a step in which said protective tape is peeled off and said rear surfaces of said semiconductor elements are polished, after said step in which said front surface of said resin layer is polished.

3. A semiconductor device manufacturing method according to claim 2, wherein:
said protective tape is peeled off through ultraviolet ray irradiation.

4. A semiconductor device manufacturing method according to claim 2, wherein:
said step in which said rear surfaces of said semiconductor elements are polished is implemented before a heat treatment.

5. A semiconductor device manufacturing method according to claim 1, wherein:
said protective tape is constituted of a hardened synthetic resin achieving a bonding function.

6. A semiconductor device manufacturing method according to claim 1, wherein:
said means for electrical connection is constituted of a wiring and conductive posts.

7. A semiconductor device manufacturing method according to claim 1, wherein:
said external connection terminals are constituted of solder balls.

8. A semiconductor device manufacturing method comprising:
providing a wafer having semiconductor elements formed on a primary surface thereof, electrode pads formed at the primary surface of the wafer, and electrical connections coupled to the electrode pads;
bonding protective tape onto a rear surface of the wafer, the rear surface being opposite to the primary surface of the wafer;
setting the wafer in a die and sealing the primary surface of the wafer with a resin layer;
polishing a front surface of the resin layer;
mounting external connection terminals to the electrical connections exposed at the polished front surface of the resin layer; and
dividing the wafer into individual pieces after said mounting,
wherein the primary surface of the wafer is sealed with the resin layer after the protective tape is bonded onto the rear surface of the wafer.

9. The semiconductor device manufacturing method of claim 8, further comprising:
peeling the protective tape off the rear surface of the wafer, after said polishing.

10. The semiconductor device manufacturing method of claim 9, wherein the protective tape is peeled off the rear surface of the wafer using ultraviolet ray irradiation.

11. The semiconductor device manufacturing method of claim 8, wherein said polishing occurs before a heat treatment.

12. The semiconductor device manufacturing method of claim 8, wherein the protective tape is a hardened synthetic resin achieving a bonding function.

13. The semiconductor device manufacturing method of claim 8, wherein the electrical connections are wiring and conductive posts.

14. The semiconductor device manufacturing method of claim 8, wherein the external connection terminals are solder balls.

15. A semiconductor device manufacturing method comprising:
providing a semiconductor element having a first surface and a second surface, the first surface being an opposite surface of the semiconductor element with respect to the second surface;
forming an electrode at the first surface of the semiconductor element;
forming a wiring portion on the first surface of the semiconductor element and connected to the electrode;
forming a conductive post on the first surface of the semiconductor element and connected to the wiring portion;
bonding a protective layer on the second surface of the semiconductor element;
forming a resin layer on the first surface of the semiconductor element after said bonding a protective layer, so as to cover the first surface of the semiconductor element, the wiring portion and a side of the conductive post; and
forming an external connection terminal on the conductive post.

16. The semiconductor device manufacturing method of claim 15, wherein the protective layer is a tape comprised of a hardened synthetic resin achieving a bonding function.

17. The semiconductor device manufacturing method of claim 15, wherein the protective layer comprises a polyimide or an epoxy resin.

18. The semiconductor device manufacturing method of claim 15, wherein the external connection terminal is a solder ball.

19. A semiconductor device manufacturing method comprising:
providing a semiconductor element having a first surface and a second surface, the first surface being an opposite surface of the semiconductor element with respect to the second surface;
forming an electrode at the first surface of the semiconductor element;
forming a wiring portion on and along the first surface of the semiconductor element and connected to the electrode;
forming a conductive post on the first surface of the semiconductor element and connected to the wiring portion;
bonding a protective layer on the second surface of the semiconductor element;
forming a resin layer on the first surface of the semiconductor element after said bonding a protective layer, so as to cover the first surface of the semiconductor element, the wiring portion and a side of the conductive post; and
forming an external connection terminal on the conductive post,
a side of the semiconductor element being exposed from the resin layer and the protective layer.

20. The semiconductor device manufacturing method of claim 19, wherein the protective layer is a tape which comprises a hardened synthetic resin achieving a bonding function.

21. The semiconductor device manufacturing method of claim 19, wherein the protective layer comprises a polyimide or an epoxy resin.

22. The semiconductor device manufacturing method of claim 19, wherein the external connection terminal is a solder ball.

23. A semiconductor device manufacturing method comprising:

provenance a semiconductor element having a first surface and a second surface, the first surface being an opposite surface of the semiconductor element with respect to the second surface;

forming an electrode at the first surface of the semiconductor element;

forming a wiring portion on and along the first surface of the semiconductor element and connected to the electrode;

forming a conductive post having a first end portion and a second end portion, on the first surface of the semiconductor element, the first end portion of the conductive post being connected to the wiring portion;

bonding a protective layer on the second surface of the semiconductor element;

forming a resin layer on the first surface of the semiconductor element after said bonding a protective layer, so as to cover the first surface of the semiconductor element, the wiring portion and a side of the conductive post, the second end portion of the conductive post not being covered by the resin layer; and forming an external connection terminal on the second end portion of the conductive post, only a side of the semiconductor element being exposed from the resin layer and the protective layer.

24. The semiconductor device manufacturing method of claim 23, wherein the protective layer is a tape which comprises a hardened synthetic resin achieving a bonding function.

25. The semiconductor device manufacturing method of claim 23, wherein the protective layer comprises a polyimide or an epoxy resin.

26. The semiconductor device manufacturing method of claim 23, wherein the external connection terminal is a solder ball.

* * * * *